United States Patent
Goedicke et al.

(10) Patent No.: US 6,340,416 B1
(45) Date of Patent: Jan. 22, 2002

(54) PROCESS AND SYSTEM FOR OPERATING MAGNETRON DISCHARGES

(75) Inventors: Klaus Goedicke, Dresden; Torsten Winkler, Radeberg; Michael Junghähnel, Dresden; Fred Fietzke, Dresden; Volker Kirchhoff, Dresden; Jonathan Reschke, Radebeul, all of (DE)

(73) Assignee: Fraunhofer-Gesellschaft zur Forderung der Angewandten Forschund e.V., Munich (DE)

( * ) Notice: Subject to any disclaimer, the term of this patent is extended or adjusted under 35 U.S.C. 154(b) by 0 days.

(21) Appl. No.: 09/341,998
(22) PCT Filed: Jan. 22, 1998
(86) PCT No.: PCT/EP98/00340
§ 371 Date: Jul. 22, 1999
§ 102(e) Date: Jul. 22, 1999
(87) PCT Pub. No.: WO98/33201
PCT Pub. Date: Jul. 30, 1998

(30) Foreign Application Priority Data

Jan. 23, 1997 (DE) .......................................... 197 02 187

(51) Int. Cl.$^7$ .............................................. C23C 14/34
(52) U.S. Cl. .............................. 204/192.12; 204/289.2; 204/298.26; 204/298.08
(58) Field of Search ....................... 204/298.08, 298.03, 204/298.25, 298.16, 192.12, 192.13, 296.2, 298.26; 360/113

(56) References Cited

U.S. PATENT DOCUMENTS

| | | |
|---|---|---|
| 4,902,394 A | 2/1990 | Kenmotsu et al. |
| 5,286,360 A | 2/1994 | Szczyrbowski et al. |
| 5,303,139 A | 4/1994 | Mark |
| 5,535,906 A * | 7/1996 | Drummond ............ 204/298.08 |
| 5,584,974 A | 12/1996 | Sellers |
| 5,651,865 A | 7/1997 | Sellers |
| 6,063,245 A * | 5/2000 | Frach et al. ........... 204/298.08 |
| 6,096,174 A | 8/2000 | Teschner et al. |
| 6,132,563 A * | 10/2000 | Frach et al. ........... 204/298.08 |

FOREIGN PATENT DOCUMENTS

| | | |
|---|---|---|
| DE | 252205 | 12/1987 |
| DE | 3700633 | 5/1988 |

(List continued on next page.)

*Primary Examiner*—Nam Nguyen
*Assistant Examiner*—Gregg Cantelmo
(74) *Attorney, Agent, or Firm*—Greenblum & Bernstein, P.L.C.

(57) ABSTRACT

Magnetron discharges are pulse-operated to avoid the so-called "arcing". In the case of magnetron discharges from alternating current-fed magnetrons, the process is limited to the minor power of the energy supply because of the load-carrying capacity of the required electric components. When the magnetron discharges are fed by direct current, their effectiveness deteriorates because of the deposition of layers on the anode surfaces. The new process should enable a high supply power and prevent arcing. In magnetron discharges with at least two magnetron electrodes, the energy is supplied in such a way that at least one magnetron electrode is a cathode or anode and a number $n_1$ of direct current pulses of said polarity is supplied. The poles of at least one magnetron electrode are then reversed and a number $n_2$ of direct currents of this polarity are supplied. The process is carried on in this manner, the frequency of the direct current pulses being higher than that of the polarity reversals. The energy supply effectiveness is thus improved. This process and system enable the production of layers having the most different properties, for example for the glass, packaging, electronic, and machine construction industries.

25 Claims, 3 Drawing Sheets

FOREIGN PATENT DOCUMENTS

| | | |
|---|---|---|
| DE | 262246 | 11/1988 |
| DE | 3802852 | 8/1989 |
| DE | 4127262 | 6/1992 |
| DE | 4042287 | 7/1992 |
| DE | 4127317 | 2/1993 |
| DE | 4127504 | 2/1993 |
| DE | 4127505 | 2/1993 |
| DE | 4138793 | 5/1993 |
| DE | 4202425 | 8/1993 |
| DE | 4204999 | 8/1993 |
| DE | 4223505 | 11/1993 |
| DE | 4230779 | 3/1994 |
| DE | 4239218 | 5/1994 |
| DE | 4324683 | 11/1994 |
| DE | 4438463 | 2/1996 |
| DE | 19506515 | 3/1996 |
| DE | 19651615 | 7/1997 |
| DE | 19651811 | 6/1998 |
| EP | 0692550 | 1/1996 |
| WO | WO 94/16458 * | 7/1994 |

* cited by examiner

PROCESS AND SYSTEM FOR OPERATING MAGNETRON DISCHARGES

CROSS-REFERENCE TO RELATED APPLICATIONS

The present application is a U.S. National Stage Application of International Application No. PCT/EP98/00340 filed Jan. 22, 1998, which claims priority under 35 U.S.C. §119 of German Patent Application No. 197 02 187.5, filed Jan. 23, 1997.

BACKGROUND OF THE INVENTION

1. Field of the Invention

The invention relates to a process and an associated system for operating magnetron discharges. Magnetron discharges are used widely in vacuum coating technology. The most important field of application is magnetron atomization, also called sputtering, for depositing thin layers of metals, alloys, or reactively deposited chemical compounds, such as oxides or nitrides. Furthermore, magnetron discharges are used to generate the plasma in plasma-activated reactive vaporization. Another field of application is the generation of magnetron enhanced plasmas for the pretreatment of substrates before the vacuum coating. Important fields of application are the manufacture of optically effective layers in the glass industry, the manufacture of decorative, wear-reducing and hard layers in the tool industry and the machine construction industry, the manufacture of barrier layers in the packaging industry, and the manufacture of insulating layers for electronics and for data storage mediums.

2. Discussion of Background Information

The use of magnetron discharges in sputter processes for depositing conductive layers with good electrical conductivity is reliably controlled on a technical scale. Electrically insulating layers can be deposited by using high frequency sputtering. Because of numerous disadvantages, however, this process has only been used on a limited technical scale. With the reactive deposition of electrically insulating layers using direct current sputtering of metallic targets in a gas mixture which, in addition to inert gas, also contains amounts of reactive gasses such as oxygen or nitrogen, two fundamental difficulties arise. One difficulty is the lack of long-term stability of the discharge. By depositing insulating layers in the entire processing chamber, the electrode surfaces functioning as anodes also become coated so that the impedance of the magnetron discharge increases constantly with increasing processing time. This leads to a lack of constancy in the process parameters so that the discharge finally can no longer be ignited or so that the technical parameter limits of the power supply device no longer suffice. The second difficulty is the occurrence of arc discharges, which are called "Arcing" and which sometimes also occur when operating nonreactive magnetron discharges. This phenomenon is caused by electrical charging of insulating layers on the targets that are connected as cathodes. As a result of these charges, electrical short circuits in the form of above-mentioned arc discharges occur, which cause defects in the layers and on the target surface and inhibit a sufficient process stability. This is particularly true for reactive magnetron discharges.

It is to known, e.g., from German Patent Application No. 42 23 505, to significantly delay the coating of the anode by using a suitable geometric embodiment. As a result, the long-term stability of the magnetron discharges is improved and the usable processing time is extended, but the problem remains fundamentally unsolved.

In order to prevent the effects of "arcing", a number of passive and active wirings of magnetron discharge devices are known. It is furthermore known, e.g., from German Patent Application Nos. 37 00 633 and 42 23 505, to supply electrical glow discharges or magnetron discharges with pulsed direct current. As a result, the energy content of arc discharges that occur is limited and the production of arc discharges is prevented. Various circuits have been proposed, see, e.g., German Patent Application Nos. 41 27 317; 41 27 504; 42 39 218; 42 30 779; and International Application No. PCT/US93/12604, which was published as International Publication No. WO/94/16458, and which, in addition to the pulsed supply of direct current, also generate a slight countervoltage. Processes and devices of this kind have proven useful preferably for nonreactive sputtering of electrically conductive materials in inert gas or for low-reactive sputtering. The occurrence of high-energy arc discharges can therefore be effectively prevented. However, highly insulating layers cannot be deposited in a stable fashion in this manner and the problem of the coating of the electrode surfaces acting as anodes also remains unsolved.

It is furthermore known, e.g., from German Patent Application Nos. 252 205 and 38 02 852, to use devices with two magnetron sources for the reactive deposition of thin layers, which devices are operated with a potential-free alternating current and with which the targets function alternatingly as cathodes and anodes of the magnetron discharge. As a result, the long-term stability of the magnetron discharge is achieved, even in gas mixtures that contain amounts of reactive gasses in addition to inert gas. The range from approximately 10 kHz to approximately 150 kHz has turned out to be the most suitable frequency of alternating current. Sinusoidal or rectangular voltages are used.

Through particular wirings of magnetron discharges, e.g., LC combinations, the danger of producing arc discharges can be further -reduced, e.g., as disclosed in U.S. Pat. No. 5,303,139, and German Patent Application Nos. 41 38 793 and 42 04 999. The optimal dimensioning of such wirings, however, turns out to be extremely difficult in practice since the dimensioning of the components depends on the frequency and the impedance of the magnetron discharge. Each parameter change of the discharges, e.g., changes in the target material, the pressure, the gas composition, etc., requires a change or adaptation of the wiring. Even when all of the parameters remain constant, the impedance of the discharge in each pulse changes from the ignition phase to the burning phase so that the possibility for optimization of the wiring is fundamentally limited. As a result of this, only quantitative improvements are achieved by the proposed solution strategies. The energy of arcs that occur comes into play as energy loss in the components of the wiring.

In order to optimally adapt the power supply device to various impedances of the two magnetron discharges, it is known, e.g., from German Patent Application Nos. 43 24 683, to interrupt the energy supply in a time-controlled manner. With this kind of process, it is disadvantageous that the effectiveness of the energy supply decreases.

In order to improve the known bipolar energy supply in magnetron devices with two or more electrodes, a process and a circuit are known, e.g., from German Patent Application Nos. 44 38 463, which produce alternating current pulses with the character of a power source, i.e., in each pulse, after a very short current increase time, a constant current is supplied to the magnetron discharge. The disadvantage of this process lies in the fact that it is connected with a very high loading of the semiconductor switching elements used so that currently, the execution of the process can be technically utilized only up to a particular output of the magnetron discharge, which lies well below 20 kW. For this reason, magnetron discharges of, e.g., 100 kW, of the kind that are required for coating architectural glass, have up to this point been powered only with sinusoidal generators. The above-mentioned difficulties with regard to limiting the energy content of arc discharges possibly still occurring and thus limiting damaging effects on the layers cannot be sufficiently eliminated.

SUMMARY OF THE INVENTION

The present invention provides a process and a system for operating magnetron discharges, which improve the energy supply in magnetron discharges with at least two magnetron electrodes.

In particular, the supply of high discharge outputs should also be possible and a high efficiency of the supplied output should be achieved. The production of arc discharges should be inhibited and the production of conditions for producing such arcs should be preventatively counteracted. The process and the associated device should also be suited for adjusting a predetermined ratio of the discharge outputs at the magnetron electrodes, preferably a ratio of 1:1, when the impedance of the magnetron discharges of the individual magnetron electrodes is of different magnitudes.

According to the present invention, a process for operating magnetron discharges for vacuum coating is provided in which at least two magnetron electrodes that are supplied with energy in a pulsed fashion and are disposed in an inert gas, e.g., preferably containing amounts of reactive gasses. The process includes at least one magnetron electrode being connected cathodically and at least one magnetron electrode being connected anodically and a number greater than 1 of direct current pulses of a same current direction are supplied with a pulse frequency of between 10 kHz and 150 kHz. A polarity change is then carried out such that the connections between the magnetron electrodes and the power supply are interrupted and at least one other magnetron electrode is connected cathodically and at least one other magnetron electrode is connected anodically. In this arrangement, a number greater than 1 of direct current pulses of a same current direction are supplied with a frequency of between 10 kHz and 150 kHz. The polarity change and the supply of direct current pulses to the magnetron discharge is repeated. Moreover, the polarity change is repeated such that, on a time-averaged basis, each magnetron electrode is connected equally often cathodically and anodically.

The present invention also provides a device for carrying out the above-noted process. The device includes a vacuum chamber in which at least two magnetron electrodes are disposed, a power supply device including a direct current source, and a switch unit, e.g., a controlled switch unit. The magnetron electrodes are electrically connected to outputs of the controlled electronic switch unit, which, between two polarity changes, provides the magnetron electrodes with a number of direct current pulses greater than 1 of a same current direction with a pulse frequency of 10 kHz to 150 kHz. The controlled electronic switch unit is electrically connected to poles of the direct current source, and a control unit is connected to the controlled electronic switch unit to control the same.

The instant invention is also directed to another device for carrying out the above-noted process. The device includes a vacuum chamber in which at least two magnetron electrodes are disposed, a power supply device includes a two-way rectifier electrically coupled to an alternating current generator, and a switch unit includes a controlled electronic full bridge circuit. The magnetron electrodes are electrically connected to outputs of the controlled electronic full bridge circuit, which, between two polarity changes, provides the magnetron electrodes with a number of direct current pulses greater than 1 of a same current direction with a pulse frequency of 10 kHz to 150 kHz. Inputs of the controlled electronic full bridge circuit are electrically connected to outputs of the two-way rectifier circuit, and a control unit is connected to the controlled electronic full bridge circuit to control the same.

The process according to the invention is used to supply energy for the operation of magnetron discharges with at least two magnetron electrodes. At least one magnetron electrode is connected as an anode during a time period $T_1$ and at least one magnetron electrode is connected as a cathode. During time period $T_1$, the energy supply is pulsed at a frequency of $f_1=1/T_1$ in the middle frequency range, and a limited number $n_1$ of direct current pulses is supplied. After time period $T_1$, a polarity change is executed such that at least one other magnetron electrode is connected as a cathode and at least one other magnetron electrode is connected as an anode. In a subsequent time period $T_2$, the energy is supplied as a limited number $n_2$ of direct current pulses with a frequency $f_2=1/T_2$, likewise in the middle frequency range. In time period $T_2$, sputtering of the surface of the cathodic magnetron electrode takes place where, after the wearing away the layer deposited previously in time period $T_1$, atomization of the target material takes place. After the supply of $n_2$ direct current pulses to the magnetron electrodes, a polarity change occurs once more such that $n_1$ direct current pulses are again supplied. The process is carried on in this manner so that numbers of direct current pulses flow through the magnetron electrodes in alternating fashion in the positive and negative current direction. The frequency of the polarity changes is called the polarity change frequency, and the polarity change frequency is significantly lower than the pulse frequency. In each time period $T_1$ and $T_2$ in which at least one magnetron electrode functions cathodically and at least one magnetron electrode functions anodically, and the complementary electrical function is respectively carried out by at least one other magnetron electrode in the other time period. The numbers $n_1$ and $n_2$ of the direct current pulses can thereby be constant or can vary as a function of time.

The numbers $n_1$ and $n_2$ of direct current pulses between two polarity changes in an electrode is greater than 1, but limited to values below 50,000. The numbers $n_1$ and $n_2$ are selected as smaller as the specific electric resistance of the layers deposited on the magnetron electrodes in the anodic phase increases. This is especially true in reactive sputtering. In this manner, the assurance is made that the thickness of these deposited layers between two polarity changes remains low so that the impedance of the magnetron discharges is influenced by these layers only in an insignificant manner. The energy supplied in the form of direct current pulses to the magnetron discharges is primarily supplied as direct current or as sinusoidal current.

The system according to the invention for carrying out the process comprises a power supply device whose outputs are connected by way of a controlled electronic switch unit to the magnetron electrodes disposed in a vacuum chamber so that direct current pulses with a pulse frequency $f_1$ or $f_2$ can be generated and it is possible to reverse the polarity of the direct current pulses with the polarity change frequency. The power supply device can therefore comprise a direct current source and a controlled electronic switch unit composed of integrated electronic switches. The electronic switches integrated into the switch unit are controlled in accordance with a suitable algorithm in such a way that current pulses are generated at the output of the controlled electronic switch unit, with the pulse frequency and the current direction in accordance with the process. Preferably, the power supply device thus has the character of a current source. The power supply device, however, can also comprise a device for generating a sinusoidal current, a two-way rectifier circuit, and a controlled electronic full bridge circuit, wherein the sinusoidal current in the two-way rectifier circuit is rectified and the polarity reversal of the current pulses with the polarity change frequency is executed by the controlled electronic full bridge circuit.

One advantage of the process according to the invention is that the effectiveness of the energy supply is significantly increased. On the one hand, due to the comparatively low polarity change frequency, the output loss in the components of the controlled electronic switch unit is reduced when pulse generators are used for the energy supply. On the other hand, the effectiveness of the energy use in the magnetron discharges themselves increases. The cause for this is that previously with bipolar energy supply in the form of middle frequency alternating current, after every polarity change, i.e., after each pulse, a different local charge-carrying density distribution must build up while in the process according to the invention, this is only the case in the cycle of the significantly lower polarity change frequency. In this manner, pulse power supplies with current source characteristics can also be produced with a high output. Another particular advantage of the invention is that the effects of possibly occurring arc discharges, particularly with energy supply using high-output sinusoidal generators, are considerably lower. One cause for this is that the time period in which a magnetron electrode is connected anodically is greater than it is with a bipolar energy supply by a factor of $n_1$ or $n_2$ so that an effective regeneration of the surface of the magnetron electrodes is achieved.

One advantageous embodiment of the invention is comprised in that when supplying the direct current pulses, the magnetron electrodes are short circuited to one another between every pair of pulses.

Furthermore, for the constant discharge conditions, it is advantageous to keep the numbers $n_1$ and $n_2$ of the direct current pulses chronologically constant. With the same qualities and symmetrical disposition of the magnetron electrodes, it is suitable to select the numbers $n_1$ and $n_2$ as equal. In order to achieve a symmetry of the atomizing action of two magnetron electrodes, it is advantageous to set $n_1$ and $n_2$ as different since the impedance is generally not equal.

For particular algorithms of the process guidance of reactive magnetron discharges, it is advantageous to guide $n_1$ and $n_2$ as a function of time or particular process parameters. The numbers $n_1$ and $n_2$ can, for example, be predetermined by means of a truth table or can be obtained by in situ measurement of a plasma parameter of the magnetron discharge, which parameter is used as a guidance variable.

Furthermore, the frequencies $f_1$ and $f_2$ can be selected as equal or different, but they must always lie in the middle frequency range.

Another advantageous embodiment is that with the occurrence of an arc discharge in a magnetron electrode, the supply of additional direct current pulses in this polarity is interrupted immediately, i.e., with a time constant of maximally 5 $\mu$s, and an early polarity change is carried out. As a result, only $n_{arc}$ direct current pulses are supplied and the number $n_1$ respectively $n_2$ is not reached. Then the process according to the invention is continued. The detection of the changeover of the magnetron discharge into an arc discharge can also occur in a known manner, e.g., by monitoring the discharge voltage of the magnetron discharge. By the above-mentioned early polarity change, damaging effects of the arc discharge energy on the quality of the magnetron electrode surface is prevented and the danger of the occurrence of additional arc discharges is drastically reduced.

Accordingly, the present invention is directed to a process for operating magnetron discharges for vacuum coating in an apparatus that includes at least two magnetron electrodes disposed in an inert gas and a power supply. The process includes supplying pulsed energy from the power supply to the at least two magnetron electrodes in successively repeating first and second periods. In the first period, the process further includes cathodically connecting at least one of the at least two magnetron electrodes and anodically connecting at least one of the at least two magnetron electrodes with the pulsed energy, such that the pulsed energy in the first period is composed of a number of pulses $n_1$ of a first polarity with a frequency between 10 kHz and 150 kHz, and the number $n_1$ is greater than 1. In the second period, the process further includes cathodically connecting at least one other of the at least two magnetron electrodes and anodically connecting at least one other of the at least two magnetron electrodes with the pulsed energy, such that the pulsed energy during the second period is composed of a number of pulses $n_2$ of a second polarity that is opposite the first polarity with a frequency between 10 kHz and 150 kHz, and the number $n_2$ is greater than 1 and not equal to $n_1$.

In accordance with a feature of the instant invention, between the first and second periods, the process can further include interrupting the connection between the power supply and the at least two magnetron electrodes.

In accordance with another feature of the invention, on a time-averaged basis, each of the at least two magnetron electrodes can be equally connected cathodically and anodically.

In accordance with still another feature of the invention, the inert gas can include reactive gases.

According to still another feature of the present invention, the numbers of pulses $n_1$ and $n_2$ can be between 100 and 1,000, and the pulses can be composed of direct current pulses. Further, the numbers of pulses $n_1$ and $n_2$ may not be more than 50,000.

According to a further feature of the invention, the numbers of pulses $n_1$ and $n_2$ may not be more than 50,000, and the pulses may be composed of direct current pulses.

In accordance with a still further feature of the invention, the numbers of pulses $n_1$ and $n_2$ can be kept constant.

In accordance with another feature of the present invention, the numbers of pulses $n_1$ and $n_2$ can be predetermined from reference values.

According to still another feature of the invention, when an arc occurs in a current period composed of one of the first and second period, the process can further include interrupting the pulsed energy supplied to the at least two magnetron electrodes during the current period for a predefined time constant, and, after the time constant, immediately supplying the pulsed energy in accordance with the other one of the first and second period not that is not the current period to the at least two magnetron electrodes. Thereafter, the process may continue. Moreover, the time constant can be maximally 5 $\mu$s. Further still, the time constant can be 1 $\mu$s.

According to a further feature of the invention, the pulsed energy supplied to the at least two magnetron electrodes may be primarily in the form of direct current. Alternatively, the pulsed energy supplied to the at least two magnetron electrodes can be primarily in the form of sinusoidal current.

In accordance with a still further feature of the invention, the frequency of the pulsed energy may be 50 kHz.

The present invention is also directed to an apparatus for carrying out a process for operating magnetron discharges for vacuum coating. The apparatus includes a vacuum chamber, at least two magnetron electrodes being disposed within the vacuum chamber, a power supply device including a direct current source, and a controlled electronic switch unit coupled to poles of the direct current source. The at least two magnetron electrodes are electrically coupled to outputs of the controlled electronic switch unit to receive pulsed energy having a number of pulses $n_1$ greater than 1 of a same polarity with a frequency between 10 kHz and 150 kHz. The controlled electronic switch unit are adapted to effect a polarity change in the pulsed energy supplied to the at least two magnetron electrodes, such that the at least two magnetron electrodes receive pulsed energy having a number of pulses $n_2$ greater than 1 and different than $n_1$ of a same polarity with a frequency between 10 kHz and 150 kHz. A control unit is coupled to the controlled electronic switch unit to control the controlled electronic switch unit.

According to a feature of the invention, the frequency of the pulsed energy can be 50 kHz.

The instant invention is also directed to an apparatus for carrying out a process for operating magnetron discharges for vacuum coating. The apparatus includes a vacuum chamber, at least two magnetron electrodes being disposed within the vacuum chamber, a power supply device including a two-way rectifier circuit connected to an alternating current source, and a controlled electronic fall bridge circuit coupled to outputs of the two-way rectifier circuit. The at least two magnetron electrodes are electrically coupled to outputs of the controlled electronic full bridge circuit to receive pulsed energy having a number of pulses $n_1$ greater than 1 of a same polarity with a frequency between 10 kHz and 150 kHz. The controlled electronic full bridge circuit is adapted to effect a polarity change in the pulsed energy supplied to the at least two magnetron electrodes, such that the at least two magnetron electrodes receive pulsed energy having a number of pulses $n_2$ greater than 1 and different than $n_1$ of a same polarity with a frequency between 10 kHz and 150 kHz. A control unit is coupled to the controlled electronic full bridge circuit to control the controlled electronic full bridge circuit.

In accordance with yet another feature of the present invention, a detector circuit can be provided for detecting arc discharges in the vacuum chamber.

BRIEF DESCRIPTION OF THE DRAWINGS

The process according to the invention is explained in detail in two exemplary embodiments. In the accompanying drawings.

DETAILED DESCRIPTION OF THE PRESENT INVENTION

Figure 1:
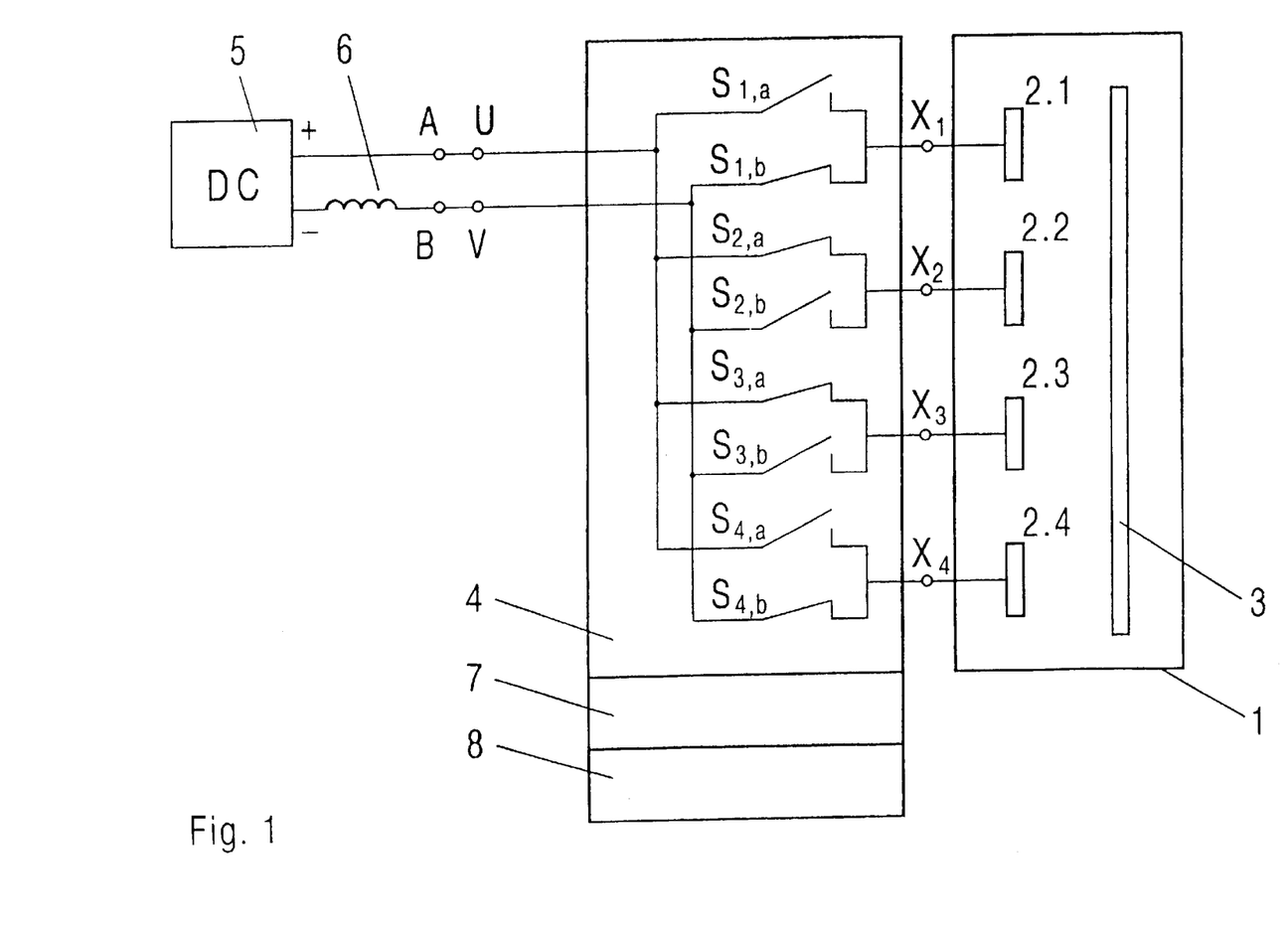
FIG. 1 shows a device for carrying out the process, with a direct current generator and four magnetron electrodes.

In FIG. 1, four magnetron electrods 2.1–2.4 and a substrate 3 to be coated are disposed in a vacuum chamber 1. The magnetron electrodes 2.1–2.4 contain the material to be sputtered in the form of targets, which have been respectively penetrated by the magnetic field of the corresponding magnetron electrode 2.1–2.4. The magnetron electrodes 2.1–2.4 are connected by way of outputs $X_1$–$X_4$ with a controlled electronic switch unit 4. Each output $X_1$–$X_4$ is respectively connected to two switches $S_a$ and $S_b$. The controlled electronic switch unit 4 is connected by way of the inputs U and V and with the poles A and B of a direct current generator 5, wherein the direct current generator 5 comprises an inductor 6 at the pole B. The control of the electronic switch unit 4 is carried out by the control unit 7. A detector circuit 8 for arc discharges is integrated into the device.

Through direct current generator 5, the inductor 6, and the controlled electronic switch unit 4, direct current pulses with constant current are generated. The supply of the direct current pulses to the magnetron discharge is carried out in such a way that the magnetron electrodes 2.1 and 2.4 are connected cathodically by virtue of the fact that the switches $S_{1.2}$ and $S_{4.1}$ are opened and the switches $S_{1.b}$ and $S_{4.b}$ are closed. The magnetron electrodes 2.2 and 2.3 are simultaneously connected anodically by virtue of the fact that the switches $S_{2.1}$ and $S_{3.a}$ are closed and the switches $S_{2.b}$ and $S_{3.b}$ are opened. The switches $S_{1.a}$ and $S_{4.a}$ are periodically opened and closed with a frequency of 50 kHz. Between every two direct current pulses, the magnetron electrodes 2.1–2.4 and the direct current generator 5 are short circuited to one another.

Another 70 direct currently pulses, a polarity change is carried out. To that end, all of the switches $S_a$ and $S_b$ are closed. Then the magnetron electrodes 2.1 and 2.4 are connected anodically by virtue of the fact that the switches $S_{1.A}$ and $S_{4.A}$ remain closed and the switches $S_{1.b}$ and $S_{4.b}$ are opened, and the magnetron electrodes 2.2 and 2.3 are simultaneously connected cathodically by virtue of the fact that the switches $S_{2.a}$ and $S_{3.a}$ are opened and the switches $S_{2.b}$ and $S_{3.b}$ remain closed. Now the switches $S_{2.a}$ and $S_{3.a}$ are periodically opened and closed with a frequency of 50 kHz. After 55 direct current pulses, a polarity change is once again carried out. The control of the individual switches $S_a$ and $S_b$ is continued in this sense. In this manner, a pulse frequency of 50 kHz is generated with 800 polarity changes per second.

Figure 3A:
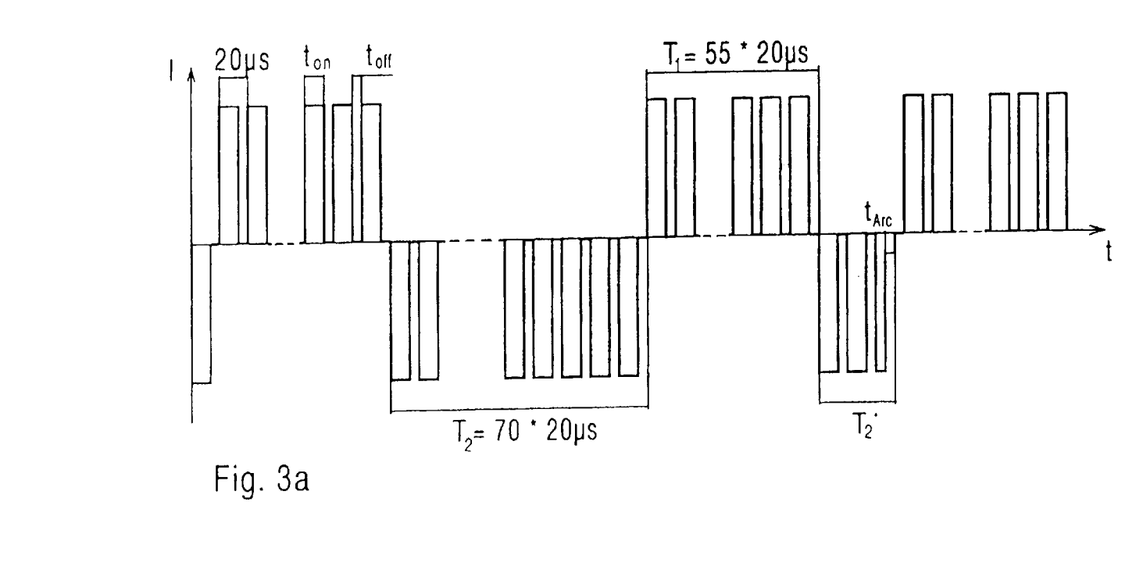
FIG. 3a shows a current progression in one of the magnetron electrodes according to FIG. 1.

The sequence of the current pulses and the respective current direction in a magnetron electrode are schematically represented in FIG. 3a. After a time period $T_1$ in which the n=55 direct current pulses are supplied and in which the magnetron electrode is connected anodically, during a time period $T_2$, $n_2$=70 direct current pulses of opposing polarity are supplied. If an arc discharge is detected by the detector circuit 8 at time $t_{Arc}$, then the supply of further direct current pulses to all cathodically connected magnetron electrodes is interrupted for a delay time of 3 µs and immediately thereafter an early polarity change is carried out. Consequently, during the time period $T^*_2$, only a number $n_{arc}$ of direct current pulses, which is less than $n_2$, is supplied.

Figure 2:
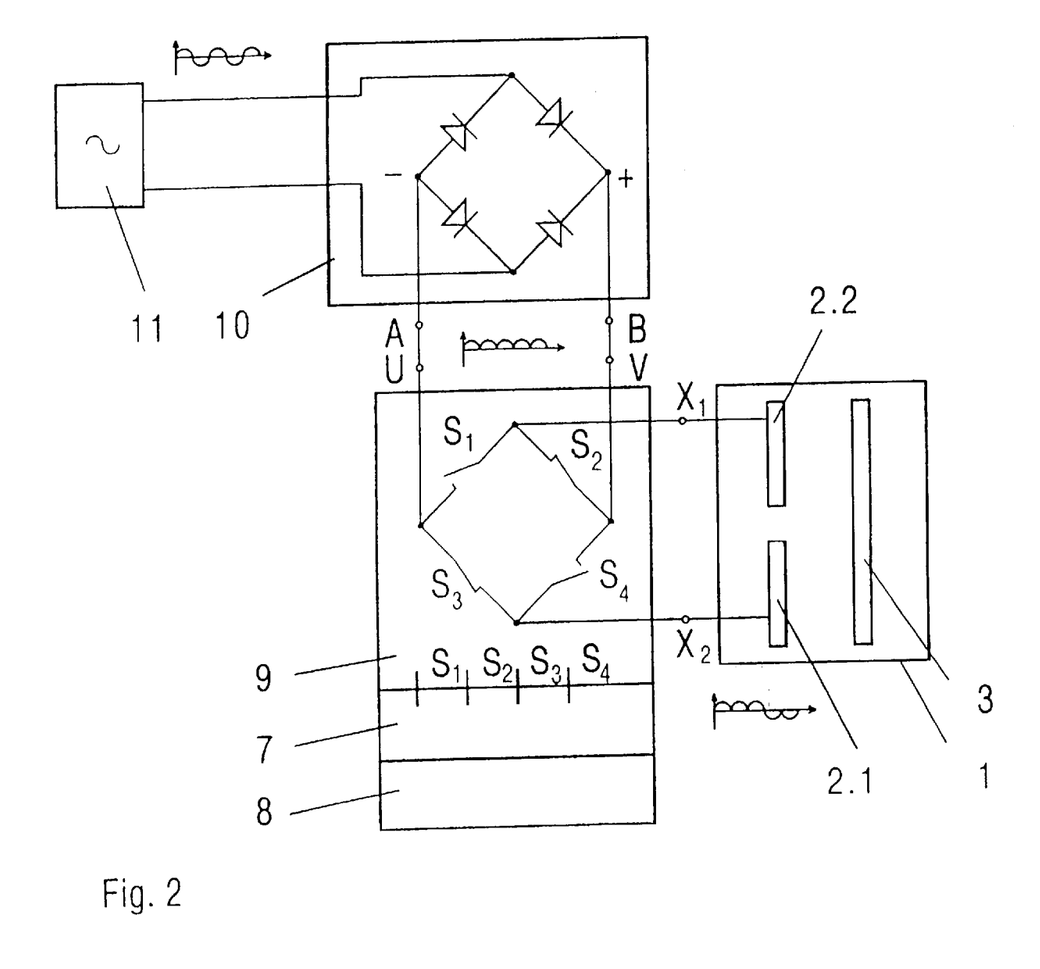
FIG. 2 shows a device for carrying out the process, with an alternating current generator and two magnetron electrodes.
Figure 3B:
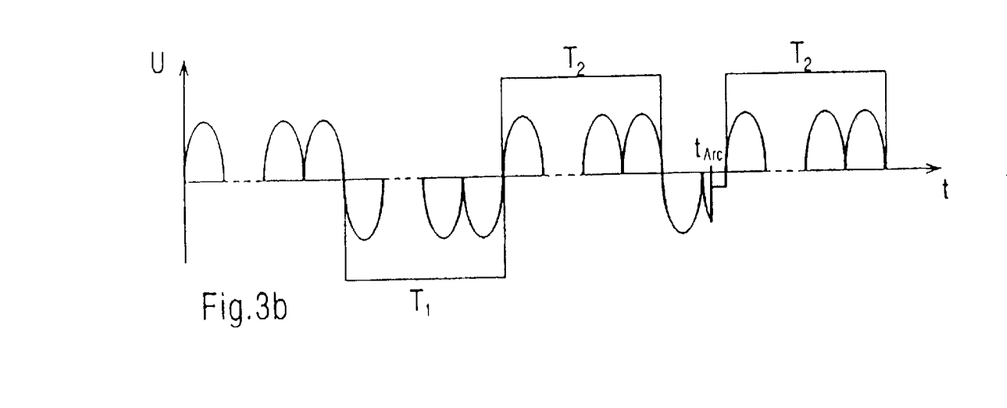
FIG. 3b shows a voltage progression in one of the magnetron electrodes according to FIG. 2.

In FIG. 2, two magnetron electrodes 2.1, 2.2 are disposed above a substrate 3 in a vacuum chamber 1. These magnetron electrodes contain aluminum targets, each of which has been penetrated by the magnetic field of the corresponding magnetron electrode 2.1–2.2. The magnetron electrodes 2.1, 2.2 are connected to the outputs $X_1$–$X_2$ of a controlled electronic full bridge circuit 9. The inputs U, V of the controlled electronic full bridge circuit 9 are connected to the outputs A, B of a two-way rectifier circuit 10, which in turn is connected to an alternating current generator 11. A control unit 7 is used to control the electronic full bridge circuit 9. Moreover, a detector circuit 8 for arc discharges is integrated into it. The sinusoidal current with a frequency of 40 kHz, which is generated by the alternating current generator 11, is converted into a pulsing direct current with double the frequency in the two-way rectifier circuit 10. The output $X_1$ is associated with the switches S1 and S2; the output $X_2$ is associated with the switches S3 and S4. The switches S2 and S3 are closed. As a result, the magnetron electrode 2.1 functions as an anode of the magnetron discharge and the magnetron electrode 2.2 functions as a cathode. The voltage progression of direct current pulses in a magnetron electrode is depicted in FIG. 3*b*. After $n_1=500$ direct current pulses, the switches S2 and S3 are opened and the switches S1 and S4 are simultaneously closed. As a result, a reversal of the current direction of the magnetron discharge is produced. Now the magnetron electrode 2.1 is the cathode of the pulsed magnetron discharge and the magnetron electrode 2.2 is the anode. After $n_2=500$ direct current pulses, a reversal of the current direction occurs once more, after which the switches S1 and S4 are opened and the switches S2 and S3 have been closed. In the described manner, the energy supply to the magnetron discharge is continued with a sinusoidal frequency of 40 kHz and a pulse frequency of 80 kHz. Thus, the current direction of the magnetron discharge changes 160 times per second if no arc discharges occur. The switches S1 to S4 are controlled by the programmable control unit 7. In this manner, the reactive magnetron discharge is operated with a power of 30 kW in order to deposit aluminum oxide onto the substrate 3 in a reactive argon-oxygen gas mixture. Between every two polarity changes, each magnetron electrode functioning as an anode becomes covered only with a coating thickness that corresponds to an average coating of 0.3 monolayers. This coating has virtually no influence on the impedance of the magnetron discharge. If an arc discharge is detected by the detector circuit 8 at time $t_{Arc}$, then the actuation of the switches S1 to S4 occurs, so that an early polarity change is carried out by virtue of the fact that the supply of direct current pulses in the given switching state is interrupted and a reversal of the current direction of the magnetron discharge is produced.

What is claimed is:

1. A process for operating magnetron discharges for vacuum coating in an apparatus that includes at least two magnetron electrodes disposed in an inert gas and a power supply, the process comprising:

supply pulsed energy from the power supply to the at least two magnetron electrodes in successively repeating first and second periods;

wherein in the first period, the process further comprises cathodically connecting at least one of the at least two magnetron electrodes and anodically connecting at least one of the at least two magnetron electrodes with the pulsed energy, wherein the pulsed energy in the first period is composed of a number of pulses $n_1$ of a first polarity with a frequency between 10 kHz and 150 kHz, and the number $n_1$ is greater than 1; and wherein the second period, the process further comprises cathodically connecting at least one other of the at least two magnetron electrodes and anodically connecting at least one other of the at least two magnetron electrodes with the pulsed energy, wherein the pulsed energy during the second period is composed of a number of pulses $n_2$ of a second polarity that is opposite the first polarity with a frequency between 10 kHz and 150 kHz, and the number $2_2$ is greater than 1.

2. The process in accordance with claim 1, wherein between the first and second periods, the process comprises:

interrupting the connection between the power supply and the at least two magnetron electrodes.

3. The process in accordance with claim 1, wherein, on a time-averaged basis, each of the at least two magnetron electrodes are equally connected cathodically and anodically.

4. The process in accordance with claim 1, wherein the inert gas includes amounts of reactive gases.

5. The process in accordance with claim 1, wherein the numbers of pulses $n_1$ and $n_2$ are between 100 and 1,000, and wherein the pulses are composed of direct current pulses.

6. The process in accordance with claim 5, wherein the numbers of pulses $n_1$ and $n_2$ are not more than 50,000.

7. The process in accordance with claim 1, wherein the numbers of pulses $n_1$ and $n_2$ are not more than 50,000, and wherein the pulses are composed of direct current pulses.

8. The process in accordance with claim 1, wherein the numbers of pulses $n_1$ and $n_2$ are kept constant.

9. The process in accordance with claim 1, wherein the numbers of pulses $n_1$ and $n_2$ are predetermined from reference values.

10. The process in accordance with claim 1, wherein, when an arc occurs a current period composed of one of the first and second period, the process further comprises:

interrupting the pulsed energy supplied to the at least two magnetron electrodes during the current period for a predefined time constant;

after the time constant, immediately supplying the pulsed energy in accordance with the other one of the first and second period not that is not the current period to the at least two magnetron electrodes; and continuing the process.

11. The process in accordance with claim 10, wherein said time constant is maximally 5 µs.

12. The process in accordance with claim 10, wherein said time constant is 1 µs.

13. The process in accordance with claim 1, wherein the pulsed energy supplied to the at least two magnetron electrodes is primarily in the form of direct current.

14. The process in accordance with claim 1, wherein the pulsed energy supplied to the at least two magnetron electrodes is primarily in the form of sinusoidal current.

15. The process in accordance with claim 1, wherein the frequency of the pulsed energy is 50 kHz.

16. The process in accordance with claim 1, wherein $n_1=n_2$.

17. The process in accordance with claim 1, wherein $n_1 \neq n_2$.

18. An apparatus for carrying out a process for operating magnetron discharges for vacuum coating, comprising:

a vacuum chamber;

at least two magnetron electrodes being disposed within the vacuum chamber;

a power supply device comprising a direct current source;

a controlled electronic switch unit being coupled to poles of the direct current source and being adapted to affect a polarity change in the pulsed energy supplied to the at least two magnetron electrodes;

the at least two magnetron electrodes being electrically coupled to outputs of the controlled electronic switch unit, such that in a first period at least one of the at least two magnetron electrodes is cathodically connected to the controlled electronic switch unit and at least one other of the two magnetron electrodes is anodically connected to the controlled electronic switch unit, wherein the pulsed energy has a number of pulses $n_1$ greater than 1 with a frequency between 10 kHz and 150 kHz, and such that in a second period said at least one of the at least two magnetron electrodes is anodically connected to the controlled electronic switch unit and said at least one other of the at least two magnetron electrodes is cathodically connected to the controlled electronic switch unit, wherein the pulsed energy has a number a number of pulses $n_2$ greater than 1 with a frequency between 10 kHz and 150 kHz; and a control unit being coupled to the controlled electronic switch unit to control the controlled electronic switch unit.

19. The apparatus in accordance with claim 18, wherein said frequency of said pulsed energy is 50 kHz.

20. The apparatus in accordance with claim 18, wherein $n_1 = n_2$.

21. The apparatus in accordance with claim 18, wherein $n_1 \neq n_2$.

22. An apparatus for carrying out a process for operating magnetron discharges for vacuum coating, comprising:

a vacuum chamber;

at least two magnetron electrodes being disposed within the vacuum chamber;

a power supply device comprising a two-way rectifier circuit connected to an alternating current source;

a controlled electronic full bridge circuit being coupled to outputs of the two-way rectifier circuit and being adapted to affect a polarity change in the pulsed energy supplied to the at least two magnetron electrodes;

the at least two magnetron electrodes being electrically coupled to outputs of the controlled electronic full bridge circuit, such that in a first period at least one of the at least two magnetron electrodes is cathodically connected to the controlled electronic full bridge circuit and at least one other of the at least two magnetron electrodes is anodically connected to the controlled electronic full bridge circuit, wherein the pulsed energy has a number of pulses $n_1$ greater than 1 with a frequency between 10 kHz and 150 kHz, and such that in a second period said at least one of the at least two magnetron electrodes is anodically connected to the controlled electronic full bridge circuit and said at least one other of the at least two magnetron electrodes is cathodically connected to the controlled electronic full bridge circuit, wherein the pulsed energy has a number of pulses $n_2$ greater than 1 with a frequency between 10 kHz and 150 kHz; and a control unit being coupled to the controlled electronic full bridge circuit to the control the controlled electronic full bridge circuit.

23. The apparatus in accordance with claim 22, further comprising a detector circuit for detecting arc discharges in the vacuum chamber.

24. The apparatus in accordance with claim 22, wherein $n_1 = n_2$.

25. The apparatus in accordance with claim 22, wherein $n_1 \neq n_2$.

* * * * *